(12) United States Patent
Lerche et al.

(10) Patent No.: US 9,851,191 B2
(45) Date of Patent: Dec. 26, 2017

(54) HIGH VOLTAGE EXPLOSIVE ASSEMBLY FOR DOWNHOLE DETONATIONS

(71) Applicant: Hunting Titan, Inc., Pampa, TX (US)

(72) Inventors: Nolan C. Lerche, Stafford, TX (US); James E. Brooks, Montgomery, TX (US)

(73) Assignee: Hunting Titan, Inc., Pampa, TX (US)

( * ) Notice: Subject to any disclaimer, the term of this patent is extended or adjusted under 35 U.S.C. 154(b) by 95 days.

(21) Appl. No.: 14/544,203

(22) Filed: Dec. 9, 2014

(65) Prior Publication Data

US 2015/0292849 A1    Oct. 15, 2015

Related U.S. Application Data

(62) Division of application No. 13/573,061, filed on Aug. 17, 2012, now Pat. No. 8,931,389.

(51) Int. Cl.
| | |
|---|---|
| *B64D 1/04* | (2006.01) |
| *F42C 19/08* | (2006.01) |
| *F42B 3/13* | (2006.01) |
| *F42D 1/05* | (2006.01) |
| *F42C 15/40* | (2006.01) |
| *H02J 7/00* | (2006.01) |
| *F42D 3/04* | (2006.01) |
| *H03K 3/537* | (2006.01) |

(52) U.S. Cl.
CPC ............. *F42C 19/08* (2013.01); *F42B 3/13* (2013.01); *F42C 15/40* (2013.01); *F42D 1/05* (2013.01); *H02J 7/0052* (2013.01); *F42D 3/04* (2013.01); *H03K 3/537* (2013.01)

(58) Field of Classification Search
USPC ........... 89/1.15; 102/202.5, 202.7, 321, 322; 175/4.53, 293
See application file for complete search history.

(56) References Cited

U.S. PATENT DOCUMENTS

| | | | | |
|---|---|---|---|---|
| 5,533,454 A | * | 7/1996 | Ellis .................... | F42D 1/05 102/202.1 |
| 8,462,525 B2 | * | 6/2013 | Drummond ........... | H02M 3/28 363/60 |

* cited by examiner

*Primary Examiner* — J. Woodrow Eldred
(74) *Attorney, Agent, or Firm* — Arnold & Saunders, LLP; Jason Saunders

(57) ABSTRACT

A downhole explosive detonation comprises a high voltage electro-explosive initiator comprising an input high voltage power supply with a low impedance shunting fuse, a flexible electrical link and a capacitor discharge unit. Explosive is initiated in a direction approximately parallel, or in another version perpendicular to the capacitor discharge unit. A unique configuration and construction of the assembly allows installation through a small service port in the gun housing structure for more efficient gun arming. A real time downhole voltage monitoring is described that transmits voltage readings to the surface during a firing sequence.

11 Claims, 17 Drawing Sheets

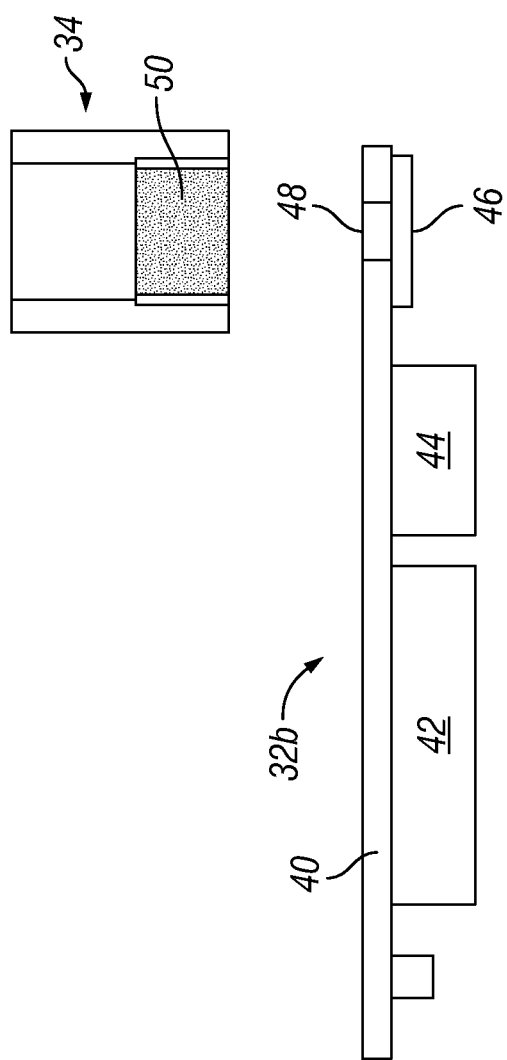

HIGH VOLTAGE EXPLOSIVE ASSEMBLY FOR DOWNHOLE DETONATIONS

RELATED APPLICATIONS

This application is a Division of application Ser. No. 13/573,061 filed Aug. 17, 2012.

BACKGROUND OF THE INVENTION

Field of the Invention

Normal hydrocarbon well perforating operations require shutting down radio frequency (RF) transmitters and eliminating stray voltage sources before arming explosive equipment such as perforating guns at the surface of an oil or gas well. The exception is for certain qualified high voltage initiators as recommended by the American Petroleum Institute (API Recommended Practice 67 (RP67), $2^{nd}$ Edition, 2007) where explosive preparations are allowed in the presence of uncontrolled external voltages. High voltage initiators (HVI) include devices that utilize exploding foil initiation (EFI) and exploding bridge wire (EBW) as the as the initiating elements. An HVI that uses an semi-conductor bridge (SCB) is safer than a hot-wire detonator but more restrictive than HVIs using EFIs and EBWs.

These technologies were adapted for downhole during the last two decades. The first commercial EFI device for downhole use is described in U.S. Pat. No. 5,088,413 by Huber et al. The efficiency of such devices is determined in part by the overall inductance of a current loop that connects a capacitor, a switch and an EFI or EBW. One simple version was designed in the 1980s by Meyers, Application of Slapper Detonation Technology to the Design of Special Detonation Systems, Los Alamos Report LA-UR-87-391 that used a two conductor flexible cable that incorporated a small hole in the flex cable that served as a barrel between the EFI and the explosive pellet. The capacitor, switch, EFI and flex cable with a hole, used as an EFI infinite flyer barrel, were all part of the same current loop that reduced total resistance and inductance. This concept was followed in the presentation of Lerche and Brooks, "Efficiencies of EFI Firing Systems," $43^{rd}$ NDIA Fuze Conference, April, 1999.

The present high voltage devices for downhole explosive detonations are physically larger than conventional low voltage detonators (commonly called hot-wire detonators that utilize primary explosive), which normally have a slim profile. Low voltage detonators typically are about 0.3-inch diameter and less than 3 inches long. One advantage in using a low voltage detonator is afforded by its small size which allows its insertion into a perforating gun or firing head housing sub-assembly through a relatively small port plug, typically $13/16$-inch or $13/8$-inch diameter, permitting easy attachment outside the gun housing of the detonator to the wireline and then to the detonating cord, for example, before inserting the armed detonator back through the port plug hole into the gun housing. High voltage devices, on the other hand, typically do not fit through port plug openings, requiring insertion through one end of a separate arming sub or a special sub, for example, making the arming operation more difficult and adds cost and preparation time at the job site.

A high-voltage device that fits through a port plug opening is needed to reduce cost, improve reliability and improve well-site safety and efficiency. Added safety is afforded by a feature that only allows electrical power to initiate the device by sending a prescribed activation signal.

SUMMARY OF THE INVENTION

The present invention disclosure describes an assembly for initiating explosives downhole using an exploding foil initiator, consisting of an input power supply, a flexible electrical link, a capacitor discharge unit and a secondary explosive transfer to a detonating cord. In one version, the explosive is initiated in a direction approximately parallel to the capacitor discharge unit and in another version the explosive is initiated in a direction approximately perpendicular to the capacitor discharge unit. The unique configurations and construction of the assembly allow installation through a small port plug hole in the gun housing structure for more efficient gun arming.

BRIEF DESCRIPTION OF THE DRAWINGS

The advantages and further features of the invention will be readily appreciated by those of ordinary skill in the art as the same becomes better understood by reference to the following detailed description when considered in conjunction with the accompanying drawings in which like reference characters designate like or similar elements throughout.

FIG. 7a is a first preferred invention embodiment showing a capacitance discharge unit configuration corresponding to FIG. 3a.

FIG. 8a is another preferred invention embodiment showing a capacitance discharge unit configuration corresponding to FIG. 3a.

DESCRIPTION OF THE PREFERRED EMBODIMENTS

Figure 1:
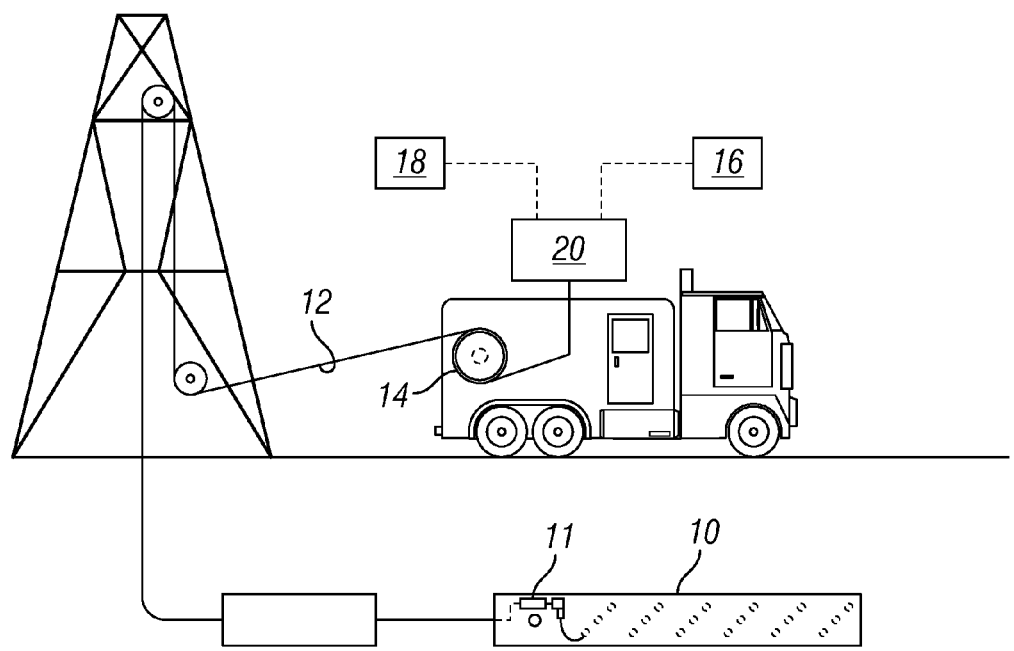
FIG. 1 schematically shows a well perforating gun operating assembly with a wireline cable and detonator.

In a typical wireline perforating operation, the perforating gun 10 is lowered into a well by way of an electrical cable 12 to position the gun at the desired portion in the reservoir (FIG. 1). Conveyance from a truck-mounted reel 14 may be by means of gravity, by fluid pressure, by pushing the gun with small-diameter tubing, or by pushing the gun down with a downhole tractor. Once the gun is positioned at the specified depth, electrical detonation power 16 connected to the cable by means of a wireline cable connector 20 to "fire" the gun by powering a detonator 11. "Firing" of the gun is represented by the detonation of specialized high explosives such as shaped charges that are radially aligned in the gun housing to produce holes in the well casing and/or reservoir to allow a flow of in situ hydrocarbons from the surrounding formation into the well.

In prior art low voltage perforating operations using hot wire detonators with primary explosive, typically with 50 Ohm input resistance, the shooting power supply 16 produces sufficient voltage, in the range of 10V to 50V at the input of the detonator, to directly initiate these types of explosive devices. However, electro-explosive initiators such as EBW (exploding bridge wire) and EFI (exploding foil initiator) detonators require a discharge voltage in the range of 1000V to 3000V for reliable initiation of a secondary explosive. Because most power supplies are limited to below 500V output, it becomes necessary to provide an integral step-up voltage power supply downhole for the EBW and EFI type detonators.

Figure 2:
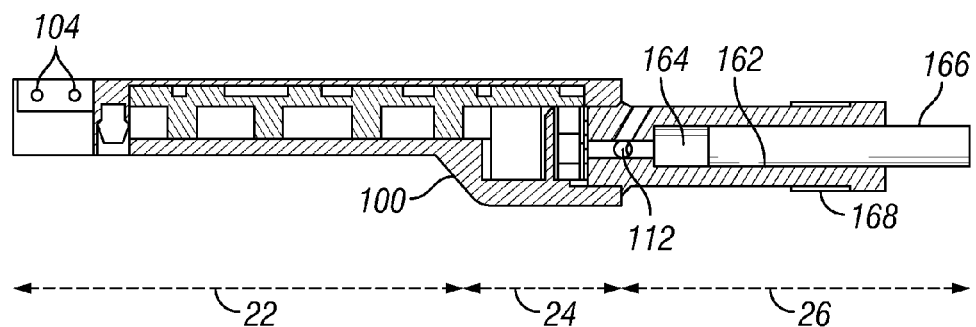
FIG. 2 is a sectional view of a prior art high voltage initiator.

A basic configuration of such a prior art EFI detonator as described by U.S. Pat. No. 6,752,083 by Nolan C. Lerche et al, is represented by FIG. 2, and may be composed of three sections: circuitry 22 to boost downhole voltage (first section), a capacitor discharge unit (CDU) 24 (second section) and an explosive housing 26 (third section) which includes a small explosive pellet 112. A support structure 100 consolidates and houses the cooperative components of the first and second sections. An electric cable connector 104 connects a power source 16 to the active elements of the voltage multiplier circuit 22 within the support structure. A bore 162 within the explosive housing is sized to receive a booster explosive 164 proximate of the explosive pellet 112. In intimate contact with the booster 164, the end of a detonating cord 166 is clamped within the bore 162 by a threaded collet mechanism 168.

The prior art example shown by FIG. 2 is of a typical EFI detonator device typically assembles the three sections 22, 24, and 26 in rigid alignment along a common axis making a total length of about 5 inches or greater which is too long to fit through the gun housing service ports of most gun systems. Sections 22 and 24 contain close-coupled, high voltage electronic components that are arranged on the same circuit support structure which determines in large part the overall length of the assembly, making it impossible to fit the detonator through a small port plug hole of most guns.

The present invention, represented schematically by FIGS. 3a and 3b are the embodiments of designs that overcome the length disadvantage of prior art such as that of FIG. 2. In its simplest form, the present invention also has three sections including the voltage multiplier section 30, a capacitive discharge unit coupled to an EFI 32 and an explosive housing 34 which contains one or more small explosive pellets 164 (FIG. 9), where sections 32 and 34 are rigidly attached. Distinctively, the voltage multiplying section 30 and the capacitive discharge section 32 are joined by a short section of flexible electrical link 36 about 1 inch in length, for example, capable of carrying high voltage. The prior art contained its electronics on a flex cable for single unit assembly. A flex cable is unnecessary for the section 30 because, unlike section 32, there is no need for low inductance for the voltage step-up section. Moreover, a sturdy circuit board is more robust for handling.

In one version of the invention, FIG. 3a, the explosive housing section 34 is physically angled relative to the capacitive discharge section 32a. The flexible link 36 allows the first section 30 to pivot relative to the second section 32a while maintaining electrical connection through two wires. The width (less than 0.70 inch) of the two sections 30 and 32a is less than the $^{13}/_{16}$-inch diameter opening of a standard perforating gun service port, and fits easily through the opening. The individual lengths of the two sections 30 and 32a are less than the allowed clearance inside a small diameter 2⅞ inch gun, for example, and are easily placed inside the gun section through a standard service port. By the third section being angled approximately perpendicular to the second section, it too, fits easily inside the gun section, after it is affixed outside the gun to a booster that is connected to flexible detonating cord.

Figure 16:
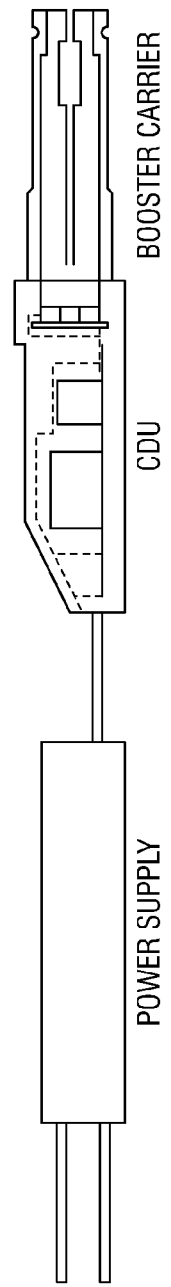
FIG. 16 is a schematic for one embodiment of the overall assembly detonator.

FIGS. 3b and 16 show another embodiment of the invention that is suited for larger service ports, such as the common 1⅜-inch diameter port plug used with a small diameter 2⅞ inch gun. The capacitive discharge section 32b is in-line with the explosive housing 34. The larger diameter service port allows easy insertion of an in-line 34 and 32b with flexible link 36 and voltage multiplier 30 following.

Partitioning the rigid voltage multiplier section 30 from the rigid unit of sections 32 and 34 is the simplest configuration of the invention and the presently preferred embodiment. However, three or more rigid sections with pivoting electrical connections is also possible, and would allow for more electronic features to fit through a service port.

Figure 3:
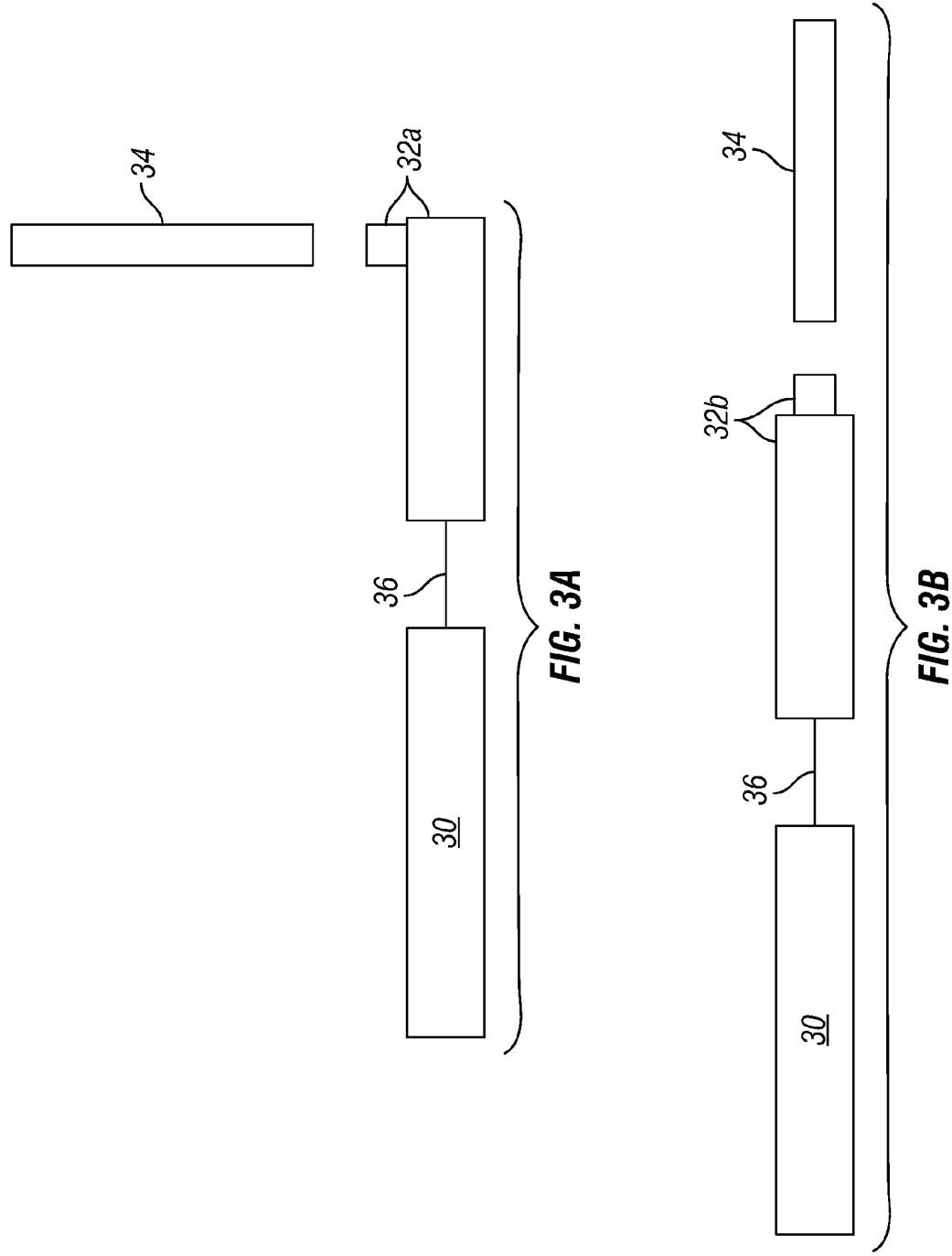
FIG. 3a is a block diagram of a first invention embodiment.
FIG. 3b is a block diagram of a second invention embodiment
Figure 4:
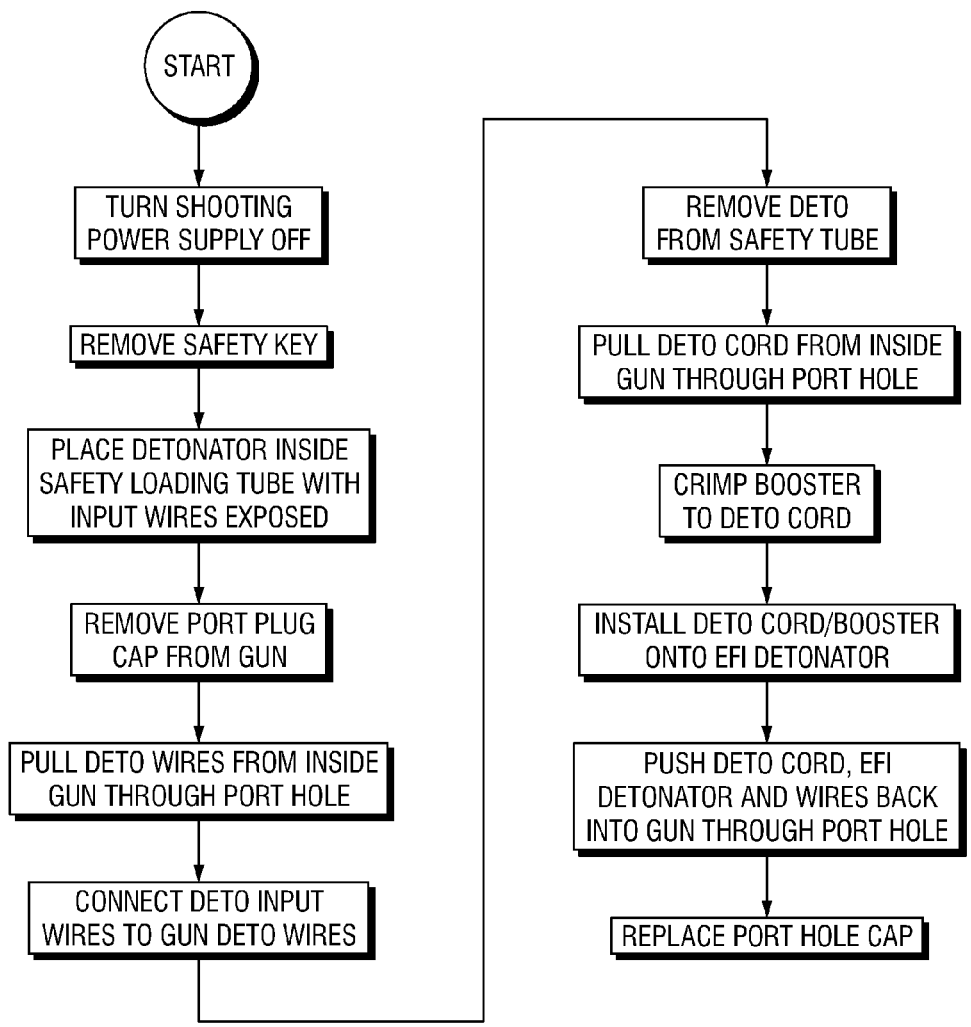
FIG. 4 is a flow chart of the present invention arming procedure

A flow chart of the loading procedure is given in FIG. 4. A typical loading procedure at the well site would have the assembly of FIG. 3a or 3b connected to wireline wires that have been routed from inside of the gun through the service port hole. The electrical connection is normally done with the assembly inside a safety tube to prevent bodily injury in case of accidental firing. After the electrical connection is made, the end of the detonating cord, also routed through the service port from inside the gun, is capped with a booster-shelled explosive, inserted into the explosive housing section 34 and secure by a collet clamp. Once the assembly is attached to the booster/detonating cord, the linking cord and explosive housing section of the assembly is inserted through the port plug and rotated until sections 34 and 32 are inside the gun section. Finally, section 30 and its connection wires are inserted, enabled by the flexible link that allows section 30 to pivot relative to section 32. The port plug is then secured to the gun section.

Figure 5:
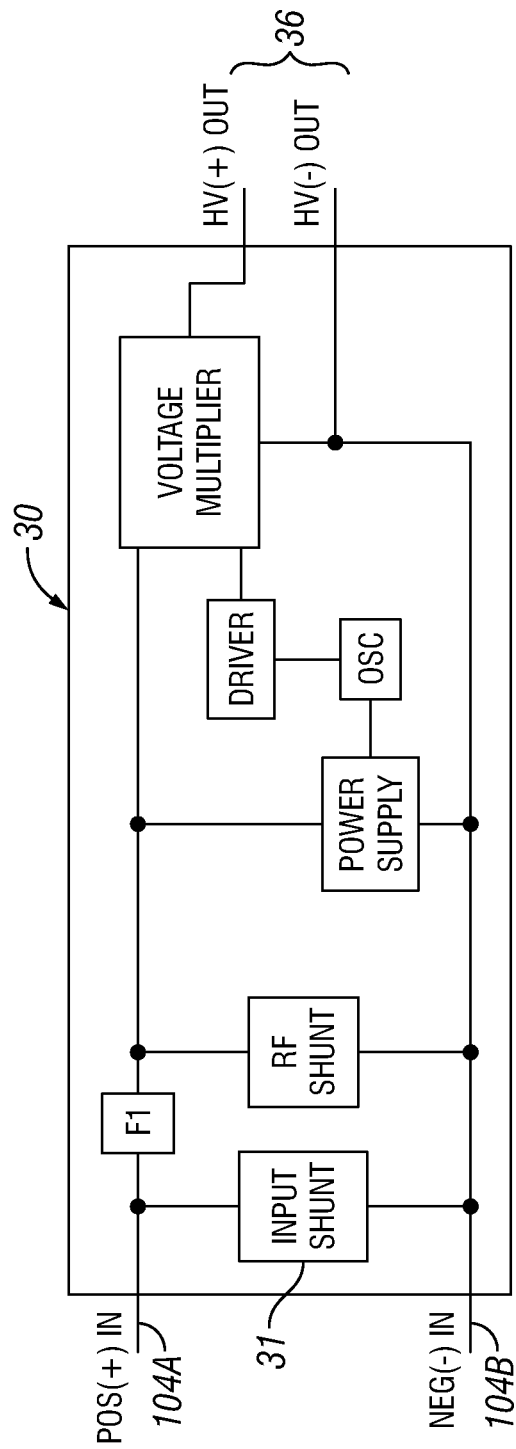
FIG. 5 is a preferred voltage multiplier schematic with low impedance shunt
Figure 6:
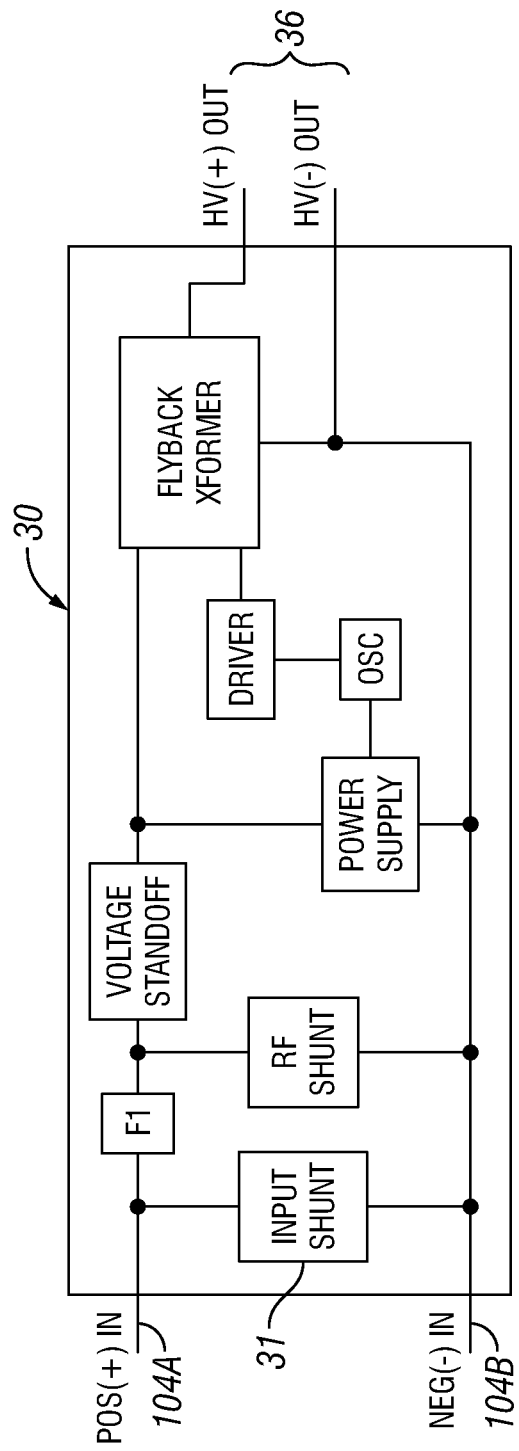
FIG. 6 is a flyback concept for stepping up the input voltage with the addition of low impedance shunt.

A more detailed description of alternative embodiments of a voltage multiplier and accompanying electronics 30 is shown by FIGS. 5 and 6. The electronic components are mounted on a hard circuit board. Two input wires 104A and 104B are attached to the board and used to make electrical connection to the wireline 12. A commutating diode allows only positive voltage to power the circuit. A flexible link 36 unsupported by the board attaches to the output side and connects to section 32. In one embodiment, the link is composed of two short wires; in another embodiment, the link connects to the second section 32 by an unsupported flexible cable.

A unique feature of the FIGS. 5 and 6 embodiments is the inclusion of a low-impedance shunt 31 that is electrically in parallel with the input wires, and having a value in the range of 10 to 500 Ohms, for example, 50 Ohms. For low voltage applications, the first section 30 presents low input impedance onto the wireline. At higher voltages the low impedance shunt 31 opens or maintains a constant current load, presenting higher input impedance for section 30 at higher input voltages. Existing high-voltage detonators have high input impedance, typically between 2,000 and 50,000 Ohms, depending on the device. The resulting charging current is therefore much smaller than that presented to a 50 Ohm hot-wire detonator, for example. The lower current typical for high-voltage detonators makes it difficult to detect the presence of these types of detonators by monitoring current change at the surface when they are switched onto the wireline. The low impedance shunt 31 allows current to be more easily detected at the surface at low voltages during normal firing sequences, as is now common for conventional hot-wire detonators with 50 Ohm resistance. This shunt feature is particularly advantageous when using electronic downhole switches with the present invention to detect a failed or shorted downhole electronic switch when used with high voltage detonators. Some typical electronic downhole switches are described in U.S. Pat. No. 6,283,227 by Lerche et al and U.S. Patent Publication No. 2011/0066378 filed Nov. 3, 2010 by Lerche et al.

One embodiment of a low-impedance shunt is a fusing resistor. Another embodiment would be a depletion mode field effect transistor (DFET) in series with a 50 Ohm resistor, as an example. The DFET and series 50 ohm resistor is again placed in parallel with the input wires of the detonator. A current sense resistor also in series with the DFET and limits the current through the DFET to a predetermined level.

There are other embodiments where a high voltage, high impedance detonator presents a low impedance with low wireline voltages typical during downhole communication of electronic perforating switches. The low impedance shunt can be part of the electronic switch or anywhere between the switch and the detonator.

Figure 7A:
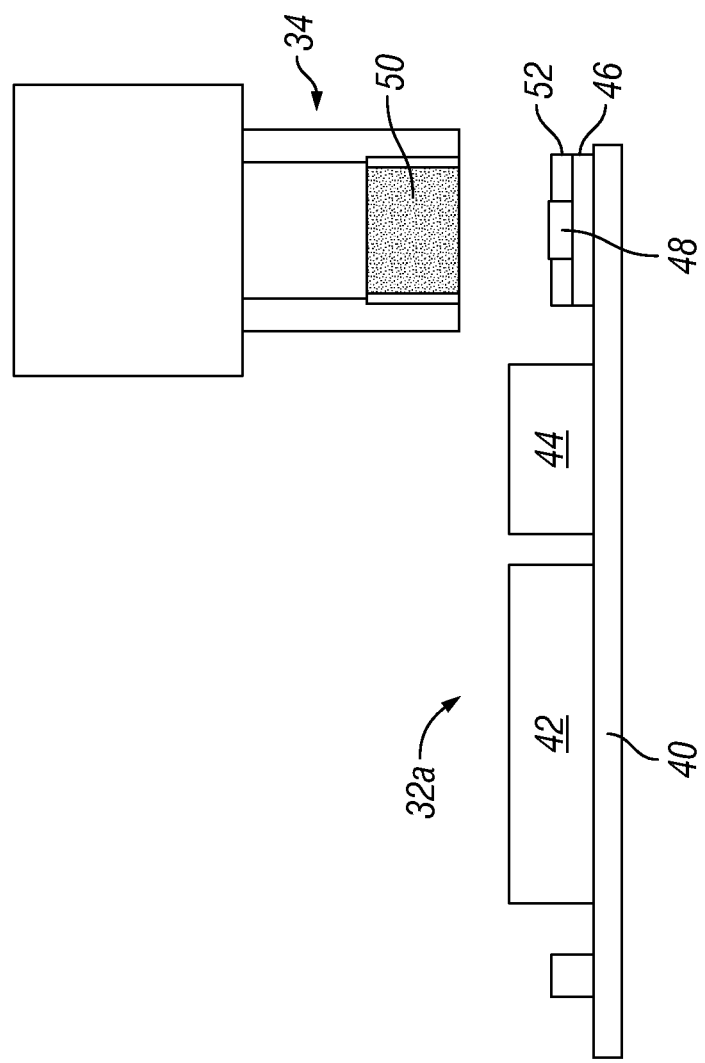

Two embodiments of the present invention second section 32 are represented schematically by FIGS. 7a and 8a and correspond to FIG. 3a (perpendicular alignment with section 34). A CDU circuit including a ceramic capacitor 42 and switching component 44 (spark gap) mounted on a thin, low inductance flex cable, which may or may not include a more rigid composite section. The circuit is supported along a rigid mechanical support 40 underneath. In one embodiment, a controlled gap 48 of between 0.005-0.015 inches separates the top of an EFI 46 and the bottom of an explosive pellet 50, The FIG. 7a embodiment engages a small insulated spacer 52 between the EFI 46 and the explosive pellet to control the gap 48 spacing. In the FIG. 8a embodiment, the control gap 48 is a perforation in the flexible cable and support structure between the EFI 46 and the explosive pellet 50 abutting the flexible cable/support structure 40.

It is clear to one skilled in the art that other electro-explosive initiators besides an EFI can be used, such as an EBW or an SCB.

Figure 7B:
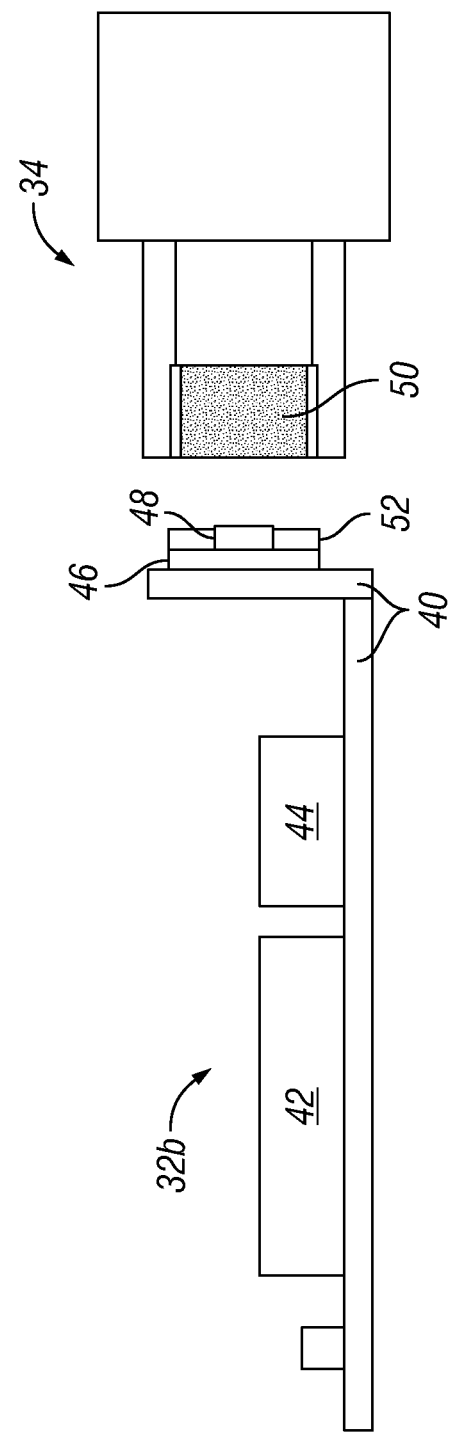
FIG. 7b is a second preferred invention embodiment showing a capacitance discharge unit configuration corresponding to FIG. 3b.
Figure 8B:
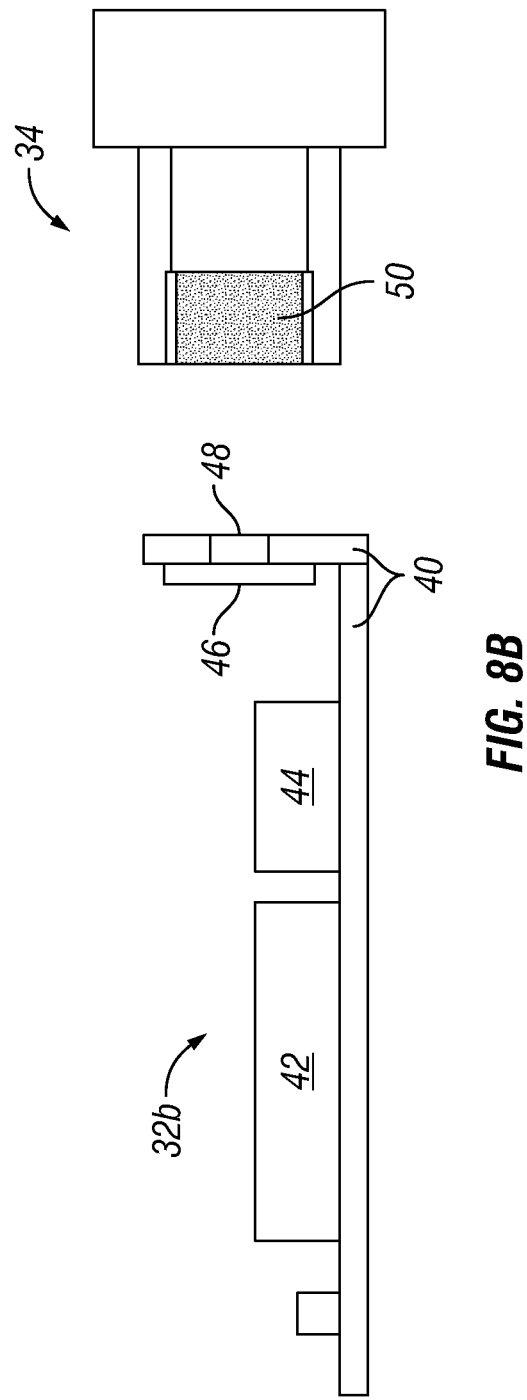
FIG. 8b is another preferred invention embodiment showing a capacitance discharge unit configuration corresponding to FIG. 3b.

Two other embodiments of the present invention section 32 are represented schematically by FIGS. 7b and 8b and correspond to FIG. 3b (parallel alignment with section 34). Here the rigid support 40 only supports the low inductance cable up to the EFI 46, allowing that portion of the cable to be bent as shown.

Figure 17:
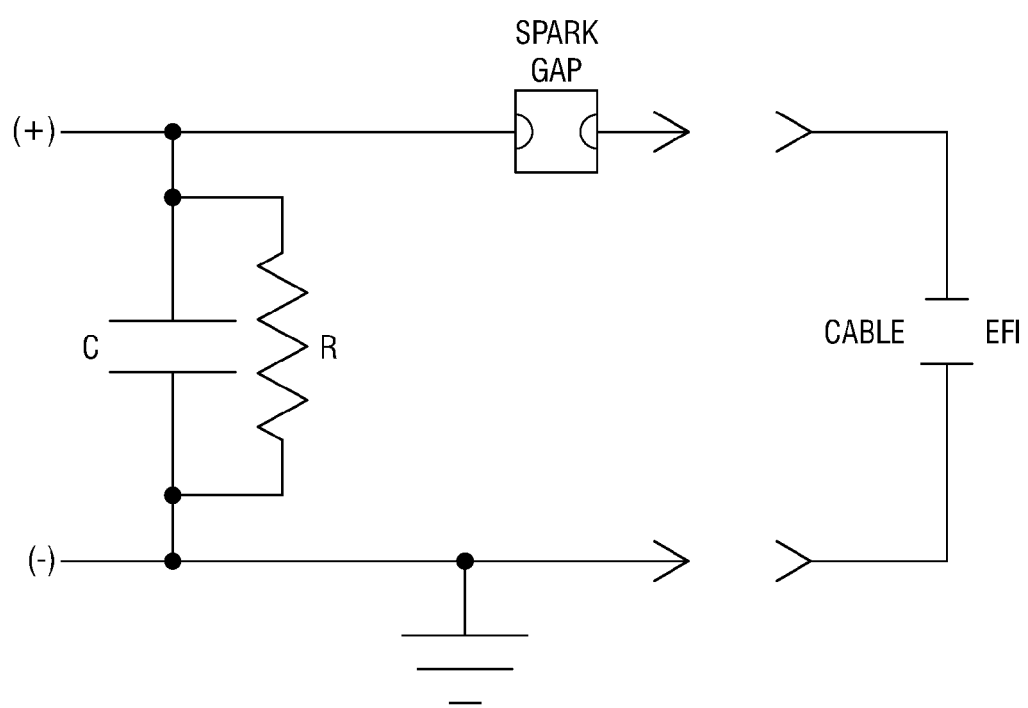
FIG. 17 is a circuit schematic of the CDU with separate flexible cable containing an EFI
Figure 18A:
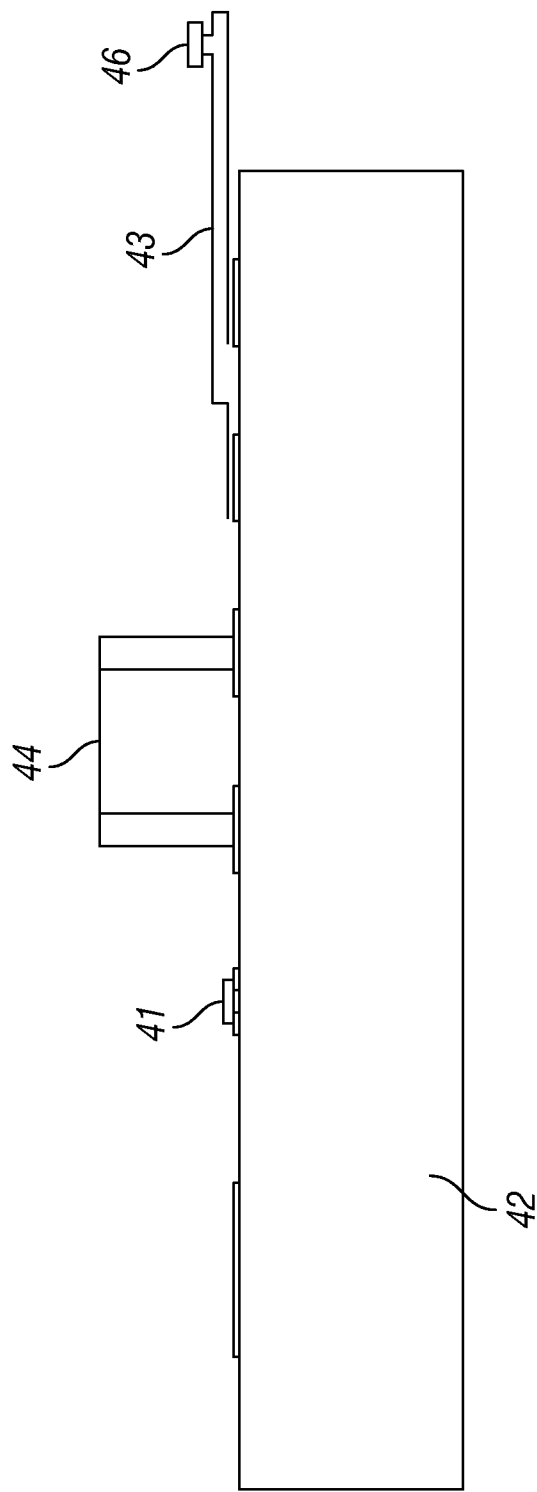
FIG. 18a shows a CDU where the spark gap and bleed resistor are mounted on the capacitor with a separate flexible cable with EFI aligns vertically
Figure 18B:
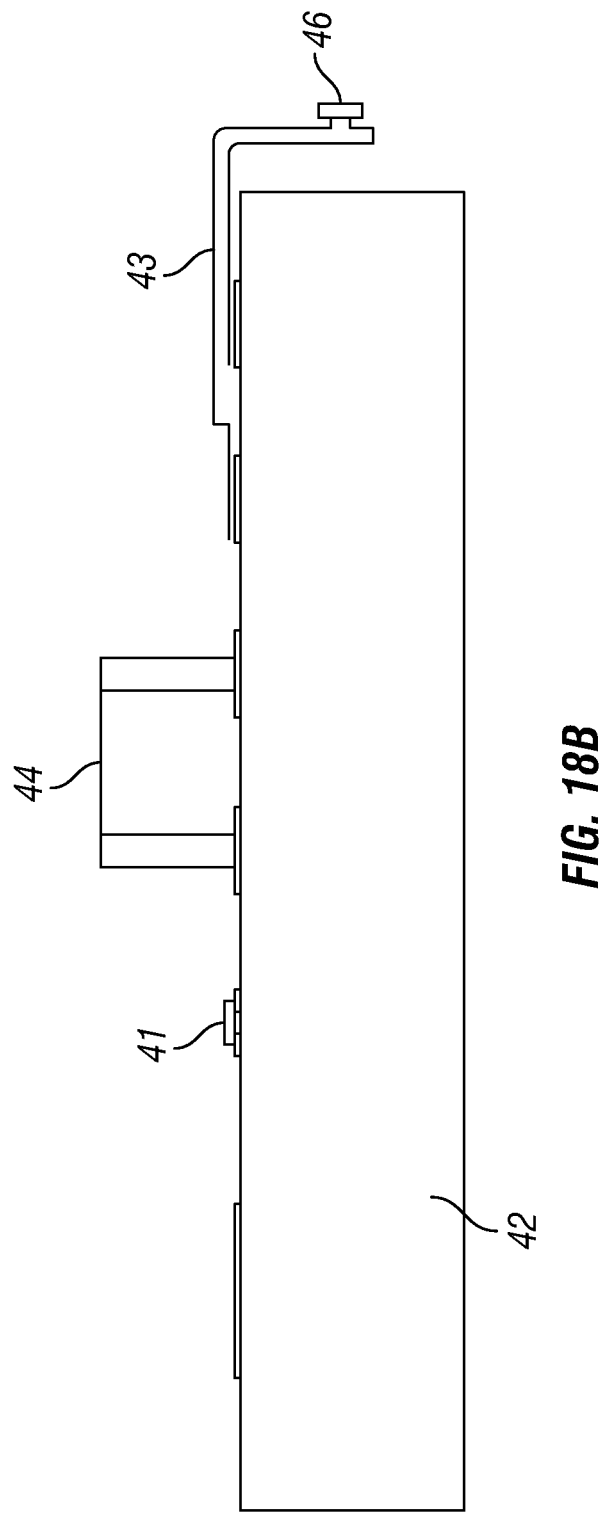
FIG. 18b shows a CDU where the spark gap and bleed resistor are mounted on the capacitor with a separate flexible cable with EFI aligns horizontally

Two more embodiments of the present invention section 32 are shown in FIG. 18 which uses a portion of the structural surface of the firing capacitor 42 as an substrate for supporting the bleed resistor 41 and the switching component 44, all in an integrated CDU (see FIG. 17 for circuit schematic). Advanced Monolythic Ceramics, for example, offers such construction. This eliminates the need for the cable support 40. A separate section of flexible cable, such as a ribbon cable, 43 with an EFI 46 is soldered to the firing capacitor surface to attach the CDU to the initiator element. The flexible cable with the EFI is coupled, in turn, to the explosive section 34 as in FIG. 3a and FIG. 18a. or when after bending as in FIG. 3b and FIG. 18b.

Figure 10:
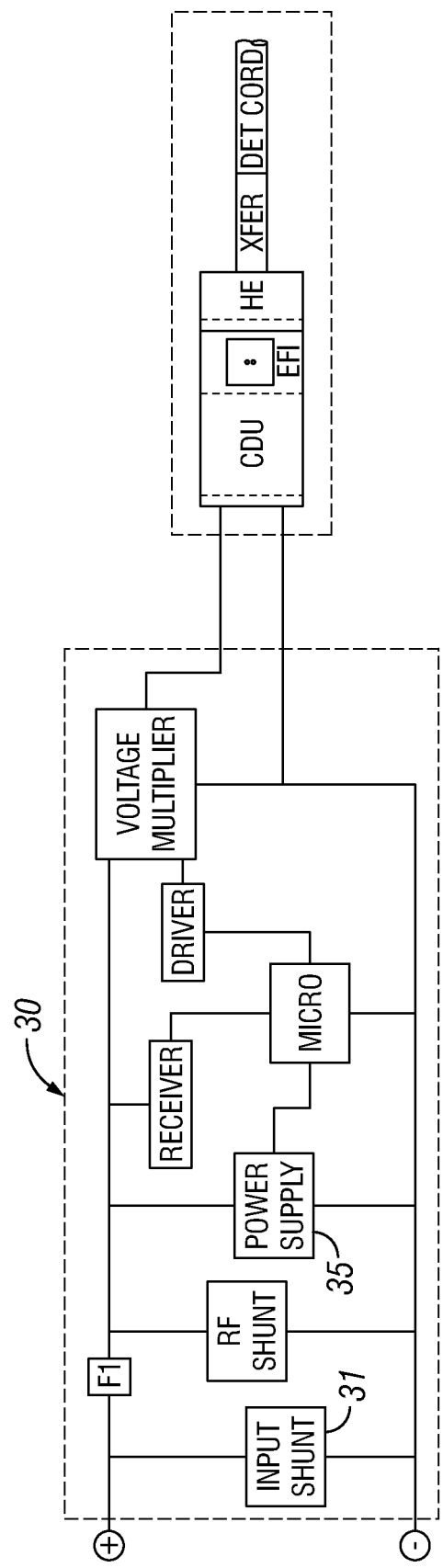
FIG. 10 is a block diagram that shows modified circuit to permit powering with an activation signal from the surface.

The most common cause of perforating fatalities is the accidental application of power to the detonator at the surface. Sending and correctly detecting an activation signal at the detonator before firing provide an extra degree of safety. An embodiment of the voltage multiplier section 30 is shown in FIG. 10 that adds this extra margin of safety. FIG. 10 differs from FIGS. 5 and 6 by the inclusion of a receiver and microprocessor for one-way communication from the surface tool control computer 18 (FIG. 1) to the voltage multiplier section 30 of the detonator. A low voltage is applied at the surface to energize the power supply 35. Next, a downlink activation signal is received and processed by the microprocessor using FSK communication. The microprocessor verifies that it has received the correct activation signal and only then allows the internal high voltage power supply to activate. Finally, shooting voltage is applied at the surface to complete the firing sequence, making for safer operations.

Figure 11:
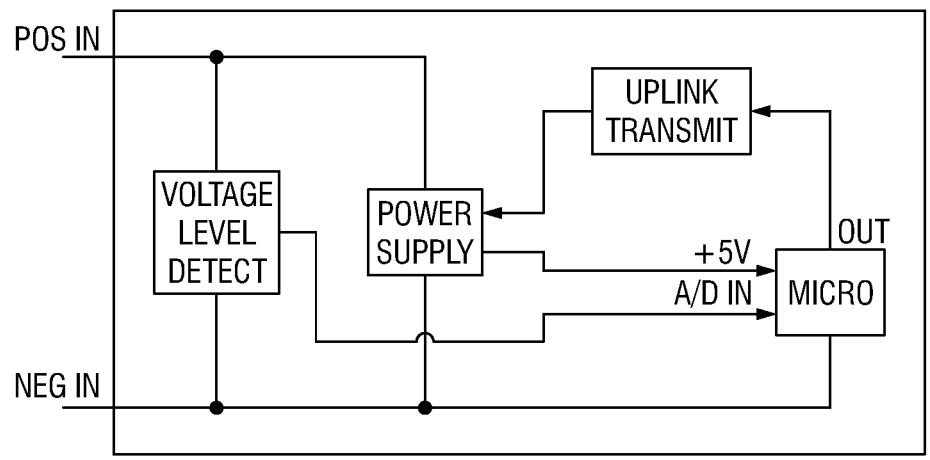
FIG. 11 is a schematic that show a circuit that detects downhole voltage and uplinks real time downhole measured voltages.
Figure 15:
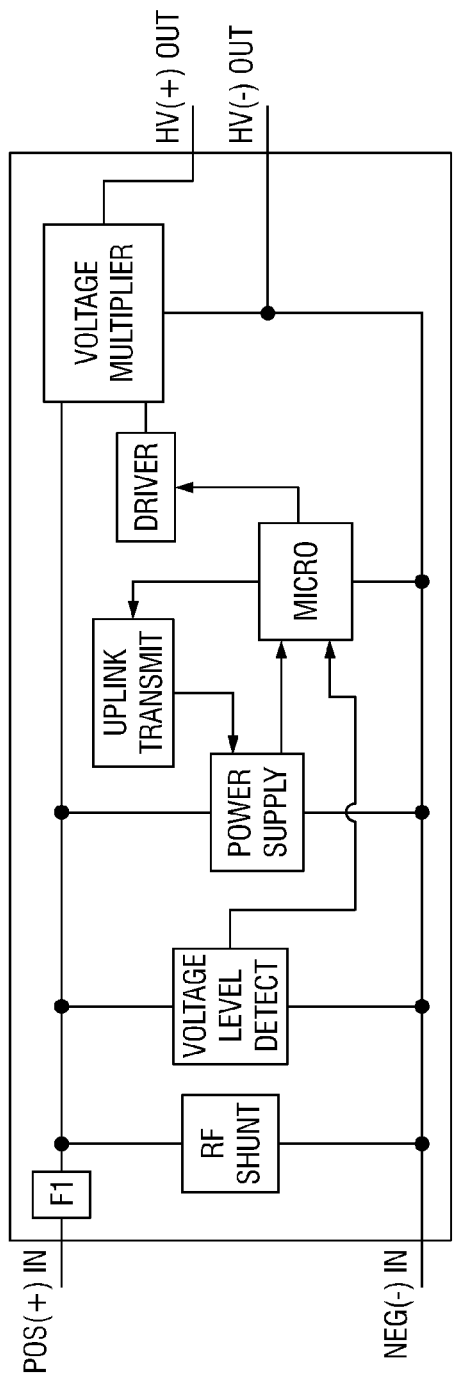
FIG. 15 is a circuit schematic for integrating a voltage detector with a detonator having a voltage multiplier as part of its power supply.

FIG. 11 is a schematic of an additional feature for the detonator that detects downhole voltage and then uplinks real time voltage levels to the surface computer 18. The voltage detect feature is on a separate circuit board in front of the voltage multiplier 30 (FIG. 5 and FIG. 6), but could also be incorporated as part of section 30 on a common board as depicted in FIG. 3 and schematically shown in FIG. 15

Referring to FIG. 11, the downhole voltage level is detected and the resulting analog signal is sent to an ND input of a microprocessor. The microprocessor then sends a digital signal to the surface computer 18 in the form of a current induced signal that rides on top of the shooting power supply voltage 16, known as current loop power line carrier. At the surface, a current viewing resistor (CVR) is placed in series with the wireline in order to detect the current deflection. This signal is then processed and the results are displayed in a plot format or as a digital value. The detector unit would automatically send a series of pulses at a selected predetermined interval.

Figure 12:
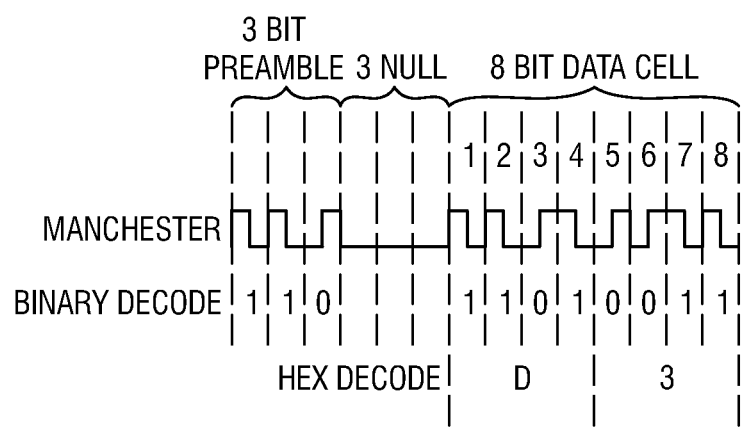
FIG. 12 is a signal format for uplink signal pulses corresponding to FIG. 11

One type of uplink signal is a binary weighted Manchester represented by FIG. 12. When surface power supply (SPS) voltage is detected downhole, a 3 bit preamble, 3 null bits and 8 bit data word is sent uplink as a power line carrier on top of the SPS voltage using the Manchester format. The bit rate can be chosen to give reliable uplink detection for a given wireline resistance and capacitance values. Typically a 100 bits/sec would work for all wirelines. The downhole signal would be an induced current in the range of (10-100) ma. Using an 8 bit word, the advantage is a high resolution signal.

Figure 13:
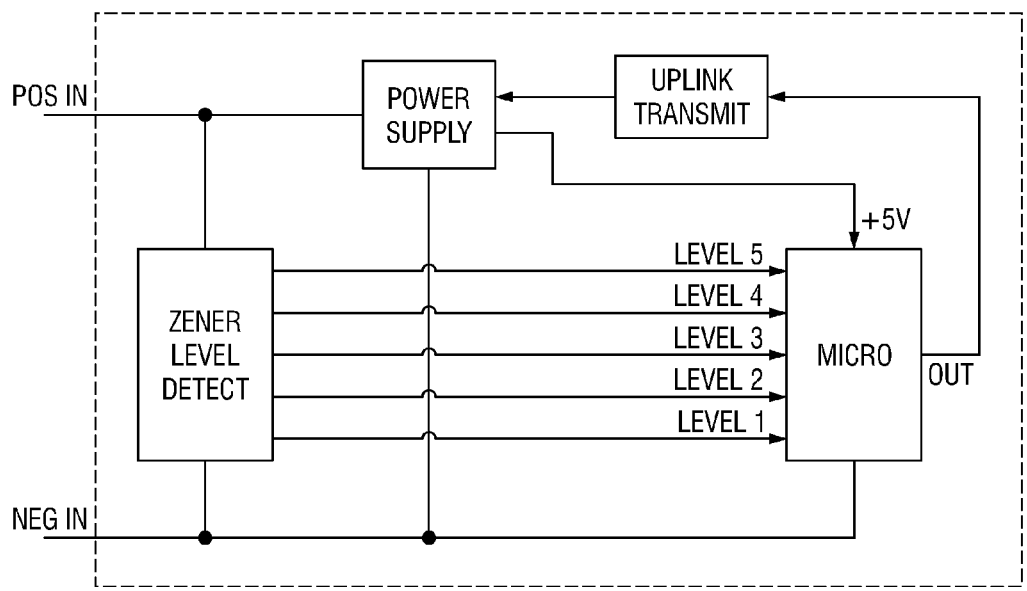
FIG. 13 is an alternative embodiment of FIG. 11

In another embodiment variation of FIG. 11, the FIG. 13 embodiment provides a series of diodes, each with a different breakdown voltage. As the downhole voltage from the power supply 16 increases, sequential signals are sent to a microprocessor which tracts the number of such signals. Each time a signal is detected a designated pulse sequence corresponding to the particular voltage is transmitted up the wireline and recorded at the surface by a computer 18. The presence of the detonator is confirmed by monitoring these received signals and the last signal corresponding to the last voltage change gives an approximation to the firing voltage of the detonator. Unless there are special provisions, whenever an electronic perforating switch is integrated into a high voltage detonator there is no surface feedback indicating that the detonator is functioning. Instrumentation of the following two methods would provide surface status for operation of a high voltage detonator.

Figure 14:
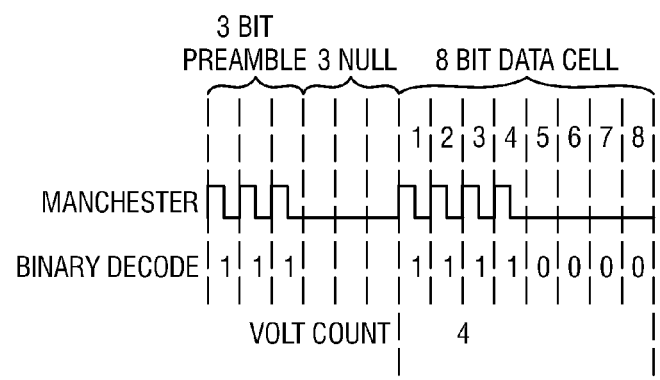
FIG. 14 is a signal format for uplink signal pulses corresponding to FIG. 13

A simple method for the uplink corresponding to FIG. 13 is shown in FIG. 14. A series of pulses is uplinked, each pulse having a predetermined weighted value. As an example each pulse could represent 50 volts, and 3 pulses would indicate 150 volts. The disadvantage is that the resolution is not as precise while the advantage would be to only count pulses at the surface.

Figure 9:
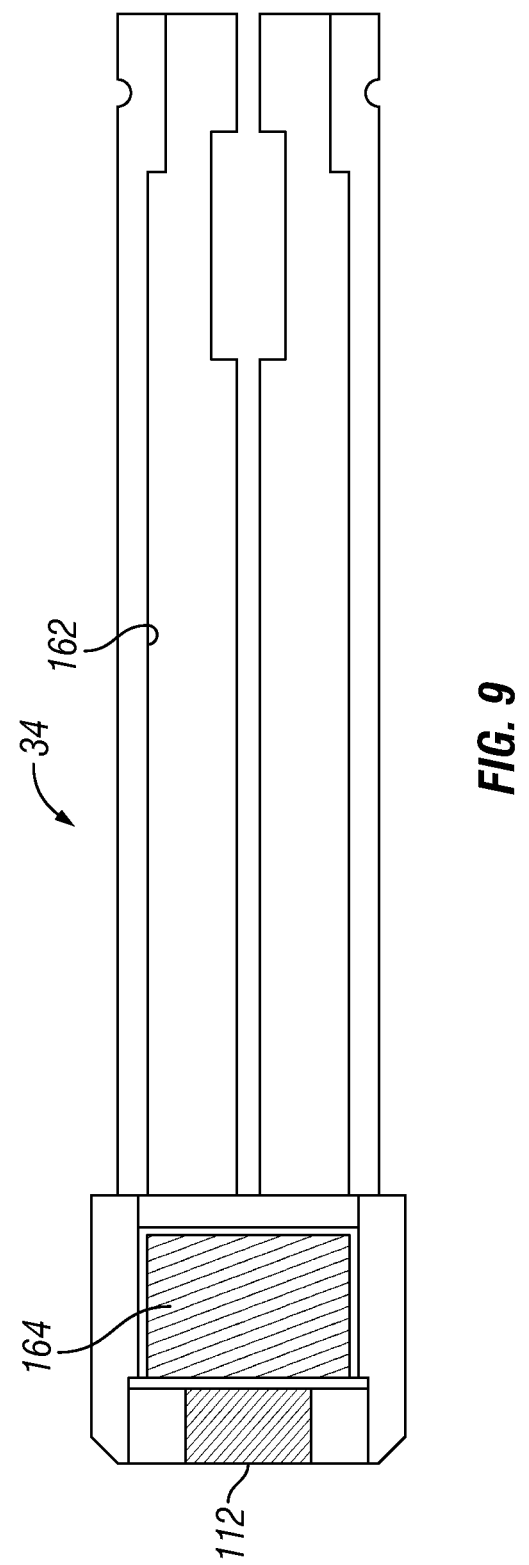
FIG. 9 is an explosive transfer holder schematic.

The third section 34 of the invention assembly as schematically illustrated by FIG. 9 attaches the output side of the explosive pellet 50 to an explosive booster 54 that is attached later and is all contained within a housing 56. The length of section 34 is short enough to fit inside a safety loading tube not shown.

The explosive pellet 50 is normally fine particle HNS (IV) or NONA, both commercially available and has been shown to work with EFIs. A stack of two explosive pellets, one of fine particle HNS at the EFI interface, topped with HMX or coarser particle HNS, for example, is also a variation. Furthermore, the explosive pellet can be included as part of section 32 or as part of section 34.

The assembly may also be configured without the explosive pellet. The explosive pellet could be incorporated into the booster and attached separately in the field.

Although the invention disclosed herein has been described in terms of specified and presently preferred embodiments which are set forth in detail, it should be understood that this is by illustration only and that the invention is not necessarily limited thereto. Alternative embodiments and operating techniques will become apparent to those of ordinary skill in the art in view of the present disclosure. Accordingly, modifications of the invention are contemplated which may be made without departing from the spirit of the claimed invention.

The invention claimed is:

1. A downhole explosive initiation system comprising:
a voltage multiplier circuit having a positive input, a negative input, a positive output, and a negative output;
a capacitive discharge unit connected to the positive output and negative output of the voltage multiplier circuit;
an electro-explosive initiator coupled to an output of the capacitive discharge unit;
wherein the voltage multiplier circuit comprises a low impedance shunt electrically in parallel with the positive input and negative input, a power supply electrically in parallel with the positive input and negative input, a communications microprocessor electrically in parallel with the positive input and negative input and electrically connected to the power supply and a voltage multiplier that is electrically in parallel with the positive input and negative input and electrically connected to the positive output or negative output.

2. The downhole explosive initiation system of claim 1 further comprising a commutating diode positioned and arranged to allow only voltage of a single polarity to power the voltage multiplier circuit.

3. The downhole explosive initiation system of claim 1 wherein the communications microprocessor comprises a transmitter and a receiver for communicating with a surface tool control computer.

4. The downhole explosive initiation system of claim 3 wherein the communications microprocessor prevents activation of the power supply unless the microprocessor has received a correct activation signal.

5. The downhole explosive initiation system of claim 3 wherein the communications microprocessor received a voltage level from a voltage detector and uplinks it to a surface tool control computer.

6. The downhole explosive initiation system of claim 1 wherein the low impedance shunt comprises a fusing resistor.

7. The downhole explosive initiation system of claim 1 wherein the low impedance shunt comprises a depletion mode field effect transistor (DFET) in series with a resistor.

8. The downhole explosive initiation system of claim 1 wherein the low impedance shunt opens at voltages greater than 50 volts.

9. The downhole explosive initiation system of claim 1 wherein the low impedance shunt provides a constant load current at voltages greater than 50 volts.

10. The downhole explosive initiation system of claim 1 wherein the electro-explosive initiator is a semiconductor bridge (SCB), an exploding bridge wire (EBW), or an exploding foil initiator (EFI).

11. The downhole explosive initiation system of claim 5 wherein the microprocessor determines whether an activation signal is correct based on an address in the activation signal.

* * * * *